United States Patent
Wen et al.

(10) Patent No.: US 9,348,952 B2
(45) Date of Patent: *May 24, 2016

(54) METHOD FOR PREDICTING HVAC ENERGY CONSUMPTION

(71) Applicant: General Electric Company, Schenectady, NY (US)

(72) Inventors: Yicheng Wen, Louisville, KY (US); William Jerome Burke, Louisville, KY (US)

(73) Assignee: General Electric Company, Schenectady, NY (US)

( * ) Notice: Subject to any disclaimer, the term of this patent is extended or adjusted under 35 U.S.C. 154(b) by 599 days.

This patent is subject to a terminal disclaimer.

(21) Appl. No.: 13/761,671

(22) Filed: Feb. 7, 2013

(65) Prior Publication Data

US 2014/0222396 A1    Aug. 7, 2014

(51) Int. Cl.
G06F 7/60 (2006.01)
G06F 17/10 (2006.01)
G06F 17/50 (2006.01)

(52) U.S. Cl.
CPC .................. *G06F 17/5009* (2013.01)

(58) Field of Classification Search
CPC ............ G06F 17/5018; G06F 17/5036; G06F 17/5009; G06F 2217/16; G05B 17/02
USPC ............................................................. 703/2
See application file for complete search history.

(56) References Cited

U.S. PATENT DOCUMENTS

| 8,321,188 B2 * | 11/2012 | Johnson ................. G06Q 10/06 703/6 |
| 2012/0083930 A1 | 4/2012 | Ilic et al. |
| 2012/0130924 A1 | 5/2012 | James |

* cited by examiner

*Primary Examiner* — Saif Alhija
(74) *Attorney, Agent, or Firm* — Dority & Manning, P.A.

(57) ABSTRACT

A method for predicting energy consumption of an HVAC system is provided. The method includes providing a model for an indoor temperature of a building, a model for an operating state of the HVAC system, and predicted future outdoor temperatures. Utilizing at least the models for the indoor temperature and the operating state of the HVAC system and the predicted future outdoor temperatures, a predicted future energy consumption of the HVAC can be estimated.

17 Claims, 3 Drawing Sheets

METHOD FOR PREDICTING HVAC ENERGY CONSUMPTION

FIELD OF THE INVENTION

The present subject matter relates generally to HVAC systems, such as residential or commercial HVAC systems, and methods for predicting energy consumption of the same.

BACKGROUND OF THE INVENTION

Commercial and residential buildings or structures are commonly equipped with systems for regulating the temperature of the air within the building for purposes of e.g., comfort, protection of temperature sensitive contents, etc. Sometimes referred to as heating, ventilating, and air conditioning or HVAC systems, such systems typically include one or more components for changing the temperature of air (i.e. air treatment components as used herein) along with one or more components for causing movement of air (i.e. blowers as used herein). For example, a refrigerant based heat pump may be provided for heating or cooling air. Alternatively, or in addition thereto, electrically resistant heat strips and/or gas burners may be provided for heating air. One or more blowers or fans may be provided for causing the heated or cooled air to circulate within the building in an effort to treat all or some controlled portion of air in the building. Ducting and vents may be used to help distribute and return air from different rooms or zones within the building.

During heating and/or cooling of air, HVAC systems consume energy. In particular, HVAC systems' energy consumption can account for more than fifty percent of a building's total energy consumption. Despite consuming large amounts of energy, HVAC systems are generally set to a specific operating temperature, and the HVAC systems operate to maintain an associated building at the specific operating temperature. Thus, the HVAC systems' operating costs are generally not considered when setting such HVAC systems. Further, it can be difficult for users to estimate their HVAC system's operating cost. In particular, it can be difficult for users to determine how their HVAC system's energy consumption is affected by factors such as the operating temperature specified by the user or an outside temperature.

Accordingly, methods for estimating or predicting energy usage of HVAC systems would be useful. In particular, methods for estimating or predicting energy usage of HVAC systems and assisting a user with evaluating a trade-off between the HVAC systems' operating temperature and the HVAC systems' operating cost would be useful.

BRIEF DESCRIPTION OF THE INVENTION

The present subject matter provides a method for predicting energy consumption of an HVAC system. The method includes providing a model for an indoor temperature of a building, a model for an operating state of the HVAC system, and predicted future outdoor temperatures. Utilizing at least the models for the indoor temperature and the operating state of the HVAC system and the predicted future outdoor temperatures, a predicted future energy consumption of the HVAC can be estimated. Aspects and advantages of the invention will be set forth in part in the following description, or may be apparent from the description, or may be learned through practice of the invention.

In a first exemplary embodiment, a method for predicting energy consumption of an HVAC system is provided. The HVAC system is configured for cooling air within a building, heating air within a building, or both. The method includes providing a model for an indoor temperature, y, of the building, providing a model for an operating state, u, of the HVAC system, providing predicted future outdoor temperatures, calculating predicted future indoor temperatures of the building and predicted future operating states of the HVAC system utilizing at least the model for y, the model for u, and the predicted future outdoor temperatures, and estimating a predicted future energy consumption of the HVAC system based at least in part on the predicted future operating states of the HVAC system.

In a second exemplary embodiment, a method for predicting energy consumption of an HVAC system is provided. The HVAC system is configured for cooling air within a building, heating air within a building, or both. The method includes providing a model for an indoor temperature, $y_k$, of the building at time k based at least in part on an interior temperature, $y_{k-1}$, of the building at time k−1, an exterior temperature, $v_{k-1}$, of the building at time k−1, and an operating state, $u_{k-1}$, of the HVAC system at time k−1, providing a model for an operating state, $u_k$, of the HVAC system at time k based at least in part on $y_{k-1}$ and $u_{k-1}$, providing predicted future exterior temperatures of the building, and estimating a predicted future energy consumption of the HVAC system utilizing at least the model for $y_k$, the model for $u_k$, and the predicted future exterior temperatures.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION OF THE INVENTION

Figure 1:
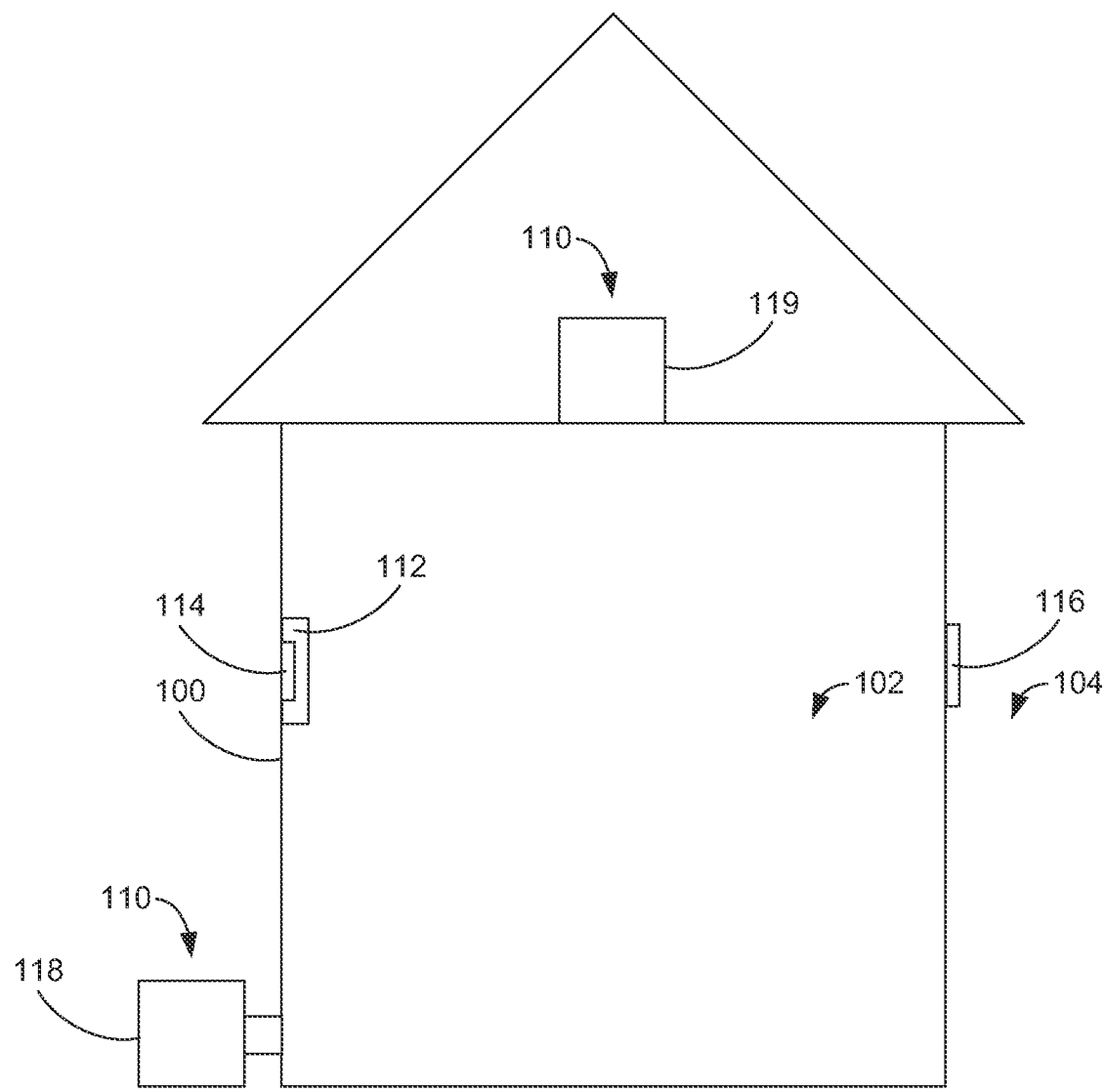
FIG. 1 provides a schematic representation of an exemplary building as may be used with the present subject matter.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 provides a schematic representation of an exemplary building 100 as may be used with the present subject matter. Building 100 includes an HVAC system 110. HVAC system 110 is configured for providing heated air to building 100, providing cooled air to building 100, or both. In particular, building 100 defines an inside or interior 102. Interior 102 of building 100 is separated or segregated from an exterior or outside 104. HVAC system 110 can heat and/or cool interior 102 of building 100.

As will be understood by those skilled in the art, HVAC system 110 can be any suitable mechanism for heating and/or cooling interior 102 of building 100. In the exemplary embodiment shown in FIG. 1, HVAC system 110 includes an air treatment component 118 for heating and/or cooling air and at least one blower 119 for directing heated and/or cooled air into interior 102 of building 100, e.g., via a duct system within building 100. As an example, air treatment component 118 can be a heat pump that provides for both heating and cooling of the air circulated by blower 119 of HVAC system 110. Alternatively, air treatment component 118 of HVAC system 110 can be a heater based on e.g., one or more gas burners or electric strips.

HVAC system 110 also includes a thermostat 112 for controlling HVAC system 110 and measuring a temperature of interior 102. A user can set an operating temperature of HVAC system 110 with thermostat 112, and HVAC system 110 can operate to maintain interior 102 of building 100 at the operating temperature. Further, HVAC system 110 includes a temperature sensor 116, such as a thermocouple or thermistor, for measuring a temperature of exterior 104 of building 100.

HVAC system 110 also includes a processing device or controller 114, e.g., positioned within thermostat 112. Various operational processes or methods of HVAC system 110 can be programmed into controller 114. As used herein, "controller" may include a memory and one or more microprocessors, CPUs or the like, such as general or special purpose microprocessors operable to execute programming instructions or micro-control code associated with operation of HVAC system 110. The memory may represent random access memory such as DRAM, or read only memory such as ROM or FLASH. In one embodiment, the processor executes programming instructions stored in memory. The memory may be a separate component from the processor or may be included onboard within the processor.

It should be understood that the shape and configuration of building 100 shown in FIG. 1 is provided by way of example only. Buildings having different shapes, configurations, different numbers of rooms, hallways, etc.—both residential and commercial—may be used with the present subject matter. Further, the location of HVAC system 110 relative to building 100 is also provided by way of example only.

HVAC system 110 consumes energy to heat and/or cool interior 102 of building 100. As discussed in greater detail below, the present subject matter provides methods for predicting energy consumption of an HVAC system, such as HVAC system 110. By predicting energy consumption of HVAC system 110, a user can more efficiently and/or cheaply operate HVAC system 110 to heat and/or cool interior 102 of building 100.

Figure 2:
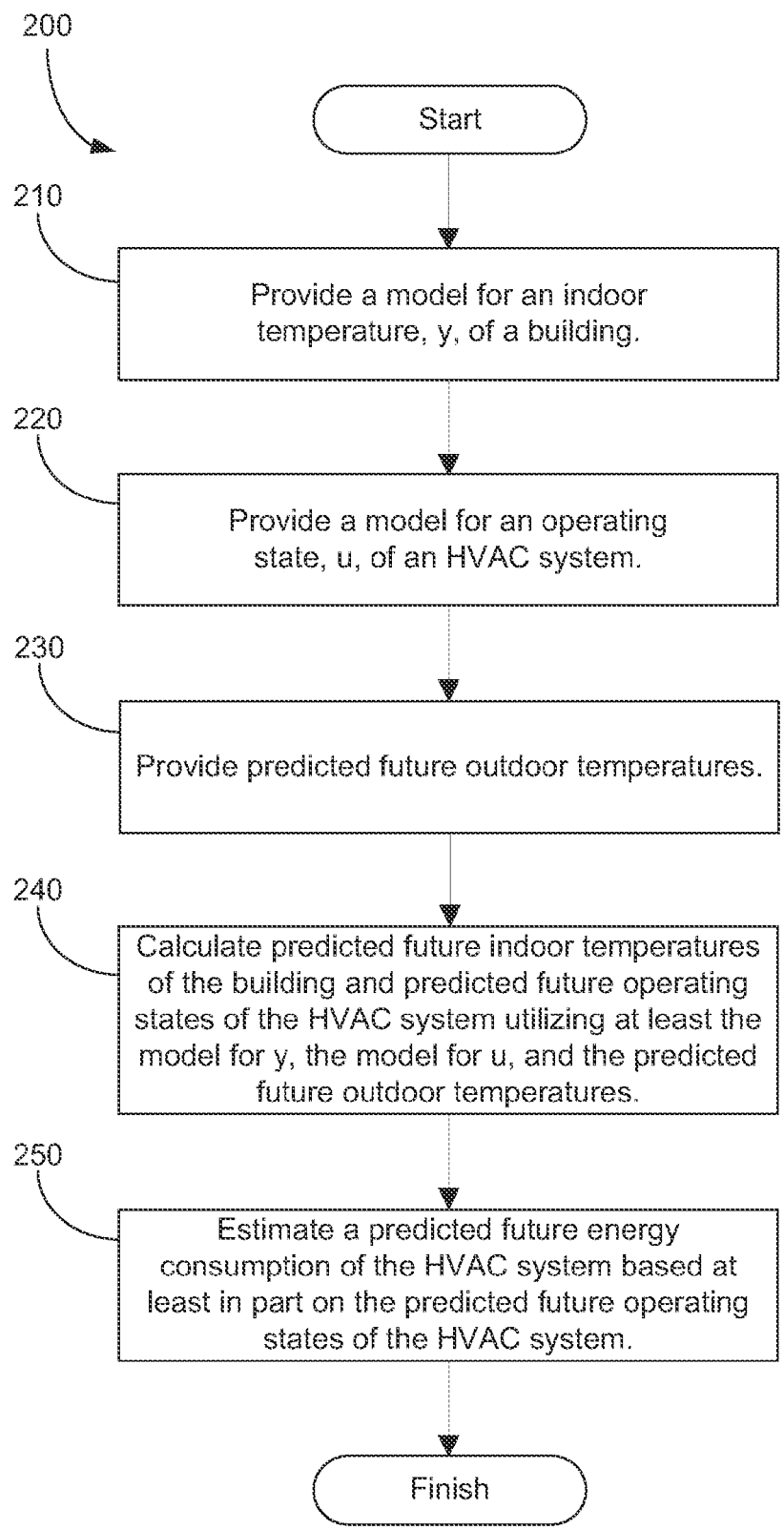
FIG. 2 illustrates a method for predicting energy consumption of an HVAC system according to an exemplary embodiment of the present subject matter.

FIG. 2 illustrates a method 200 for predicting energy consumption of an HVAC system according to an exemplary embodiment of the present subject matter. Method 200 can be used to predict energy consumption of any suitable HVAC system, such as HVAC system 110 (FIG. 1). As an example, controller 114 of HVAC system 110 can be programmed to implement method 200. Utilizing method 200, a predicted future energy consumption of HVAC system 110 can be estimated, and, e.g., a user can adjust HVAC system 110 to improve energy efficiency of HVAC system 110 or adjust an operating temperature of HVAC system 110 to reduce energy consumption of HVAC system 110. Method 200 is discussed in greater detail below.

At step 210, a model for an indoor temperature, y, of building 100 is provided. The model for y can be programmed into controller 114 such that controller 114 can calculate a predicted future indoor temperature of building 100, e.g., a predicted future temperature of interior 102. The model for y can utilize any suitable input to calculate y. For example, y can be calculated based at least in part upon a previous indoor temperature of building 100, a previous outdoor temperature of building 100, and/or a previous operational state of HVAC system 110, e.g., whether HVAC system 110 is on or off.

The model for y can be any suitable model for simulating or modeling the heat dynamics of building 100. As an example, the model for y can be a second order linear model, e.g., such that the model for y is given as $$y_k = a_1 y_{k-1} + a_2 y_{k-2} + b_1 v_{k-1} + b_2 u_{k-1}$$

where $y_k$ is an indoor temperature of building 100 at time k,
$y_{k-1}$ is an indoor temperature of building 100 at time k−1,
$y_{k-2}$ is an indoor temperature of building 100 at time k−2,
$v_{k-1}$ is an outdoor temperature at time k−1,
$u_{k-1}$ is an operating state of HVAC system 110 at time k−1, and
$a_1$, $a_2$, $b_1$, and $b_2$ are constants.

As will be understood by those skilled in the art, the model for y provided above is a discrete-time auto-regressive model with exogenous inputs, and constants $a_1$, $a_2$, $b_1$, and $b_2$ can be determined utilizing recursive least-square techniques or any other suitable technique. As an example, controller 114 can receive indoor temperature measurements from thermostat 112, outdoor temperature measurements from temperature sensor 116, and HVAC operating states from HVAC system 110 over time and calculate constants $a_1$, $a_2$, $b_1$, and $b_2$ in order to identify the model for y. As discussed above, the model for y can be any suitable model in alternative exemplary embodiments. Thus, the model provided above is not intended to limit the present subject matter in any aspect and is provided by way of example only.

At step 220, a model or control logic for an operating state, u, of HVAC system 110 is provided. Each operating state the HVAC system 110 can correspond to or be used to determine whether HVAC system 110 is on or off, e.g., whether air treatment component 118 of HVAC system 110 is heating and/or cooling air or not heating and/or cooling air and/or whether blower 119 of HVAC system 110 is moving air or not moving air. The model for u can be programmed into controller 114 such that controller 114 can calculate predicted future operating states of HVAC system 110. The model for u can utilize any suitable inputs to calculate the predicted future operating states of HVAC system 110. For example, u can be calculated based at least in part upon the previous indoor temperature of building 100, the previous operational state of HVAC system 110, and/or an operational temperature or setting of HVAC system 110, e.g., the desired temperature of interior 102 of building 100.

The model for u can be any suitable model. As an example, the model for u can be given as $$u_k = \begin{cases} 1 & \text{if } u_{k-1} = 0,\ y_{k-1} < L_{k-1} \\ 1 & \text{if } u_{k-1} = 1,\ y_{k-1} < H_{k-1} \\ 0 & \text{otherwise} \end{cases}$$

where
  $u_{k-1}$ is an operating state of HVAC system 110 at time k−1,
  $y_{k-1}$ is an indoor temperature of building 100 at time k−1,
  $L_{k-1}$ is a low set temperature of HVAC system 110 at time k−1, and
  $H_{k-1}$ is a high set temperature of HVAC system 110 at time k−1.

In the model for u shown above, HVAC system 110 is on or heating and/or cooling air when $u_k=1$. Conversely, HVAC system 110 is off or not heating and/or cooling air when $u_k=0$. As discussed above, the model for u can be any suitable model in alternative exemplary embodiments. Thus, the model provided above is not intended to limit the present subject matter in any aspect and is provided by way of example only.

At step 230, predicted future outdoor temperatures are provided. As an example, controller 114 can receive the predicted future outdoor temperatures, e.g., predicted future temperatures of exterior 104 of building 100, at step 230. The predicted future outdoor temperatures can come from any suitable source. For example, the predicted future outdoor temperatures can be based on weather forecast data or historical weather data.

As an example, weather forecast data generally includes a daily maximum temperature and a daily minimum temperature. Further, outdoor temperatures generally have a sinusoidal shape between the daily maximum temperature and the daily minimum temperature. Thus, the predicted future outdoor temperatures can be provided using the following:

$$f(t) = \begin{cases} \dfrac{T_{max}(k) + T_{min}(k)}{2} - \dfrac{T_{max}(k) - T_{min}(k)}{2}\cos\left(\dfrac{\pi(t - t_{min}(k))}{t_{max}(k) - t_{min}(k)}\right) & t \in [t_{min}(k), t_{max}(k)) \\ \dfrac{T_{max}(k) + T_{min}(k+1)}{2} + \dfrac{T_{max}(k) - T_{min}(k+1)}{2}\cos\left(\dfrac{\pi(t - t_{max}(k))}{t_{min}(k+1) - t_{max}(k)}\right) & t \in [t_{max}(k), t_{min}(k+1)) \end{cases}$$

where
  $T_{max}(k)$ is a maximum temperature on day k,
  $T_{min}(k)$ is a minimum temperature on day k,
  $t_{max}(k)$ is a time of day for $T_{max}(k)$, and
  $t_{min}(k)$ is a time of day for $T_{min}(k)$.

Utilizing the above formula, the predicted future outdoor temperatures can be provided throughout the day despite only having the daily maximum temperature and the daily minimum temperature from the weather forecast data. As discussed above, the predicted future outdoor temperatures can be determined in any suitable manner. Thus, the formula provided above is provided by way of example only and is not intended to limit the present subject matter.

At step 240, controller 114 calculates predicted future indoor temperatures of building 100 and predicted future operating states of HVAC system 110 utilizing at least the model for y, the model for u, and the predicted future outdoor temperatures. As an example, with the second-order linear model for y and the model for u provided above, controller 114 can calculate the predicted future indoor temperatures of building 100 and the predicted future operating states of HVAC system 110. With the predicted future operating states of HVAC system 110 calculated at step 240, energy consumption of HVAC system 110 can be calculated as well.

Thus, at step 250, controller 114 estimates a predicted future energy consumption of HVAC system 110 based at least in part on the predicted future operating states of HVAC system 110. Controller 114 can estimate the predicted future energy consumption of HVAC system 110 using any suitable method or mechanism. As an example, controller 114 can estimate the predicted future energy consumption of HVAC system 110 using the following, $$\sum_{k=1}^{N} ev \cdot u_k + eu_0(1 - u_k)$$

where
  $u_k$ is an operating state of HVAC system 110 at time k and $u_k \in \{0,1\}$,
  ev is an average energy usage of HVAC system 110 when HVAC system 110 is on,
  $eu_0$ is an average energy usage of HVAC system 110 when HVAC system 110 is off, and
  N is a terminal time.

Utilizing the above formula, the predicted future energy consumption of HVAC system 110 can be estimated. Thus, a user of HVAC system 110 can anticipate and evaluate an energy consumption of HVAC system 110 in light of the temperature settings or control temperatures of HVAC system 110.

In additional exemplary embodiments, the user can adjust the temperature settings of HVAC system 110 based upon the predicted future energy consumption of HVAC system 110 from step 250. For example, if the user finds the energy consumption too high, the user can adjust the temperature setting to reduce energy consumption. Conversely, the user can also adjust the temperature setting to increase energy consumption if the user finds the energy consumption sufficiently low.

In additional exemplary embodiments, controller 114 can forecast a predicted future operating cost for HVAC system 110 based at least in part on the predicted future HVAC operating states. Similarly to above, the predicted future operating cost for HVAC system 110 can be forecast using the following, $$\sum_{k=1}^{N} p(k)(ev \cdot u_k + eu_0(1 - u_k))$$

where
  $u_k$ is an operating state for HVAC system 110 at time k and $u_k \in \{0,1\}$,
  p(k) is a unit price for energy at time k,
  ev is an average energy usage of HVAC system 110 when HVAC system 110 is on,
  $eu_0$ is an average energy usage of HVAC system 110 when HVAC system 110 is off, and
  N is a terminal time.

Utilizing the above formula, the predicted future operating cost of HVAC system 110 can be estimated. Thus, a user of HVAC system 110 can anticipate and evaluate an operating cost of HVAC system 110 in light of the temperature settings or control temperatures of HVAC system 110.

In additional exemplary embodiments, the user can adjust the temperature settings of HVAC system 110 based upon the predicted future operating cost of HVAC system 110. For example, if the user finds the operating cost too high, the user can adjust the temperature setting to reduce operating cost. Conversely, the user can also adjust the temperature setting to increase operating cost if the user finds the operating cost sufficiently low.

Figure 3:
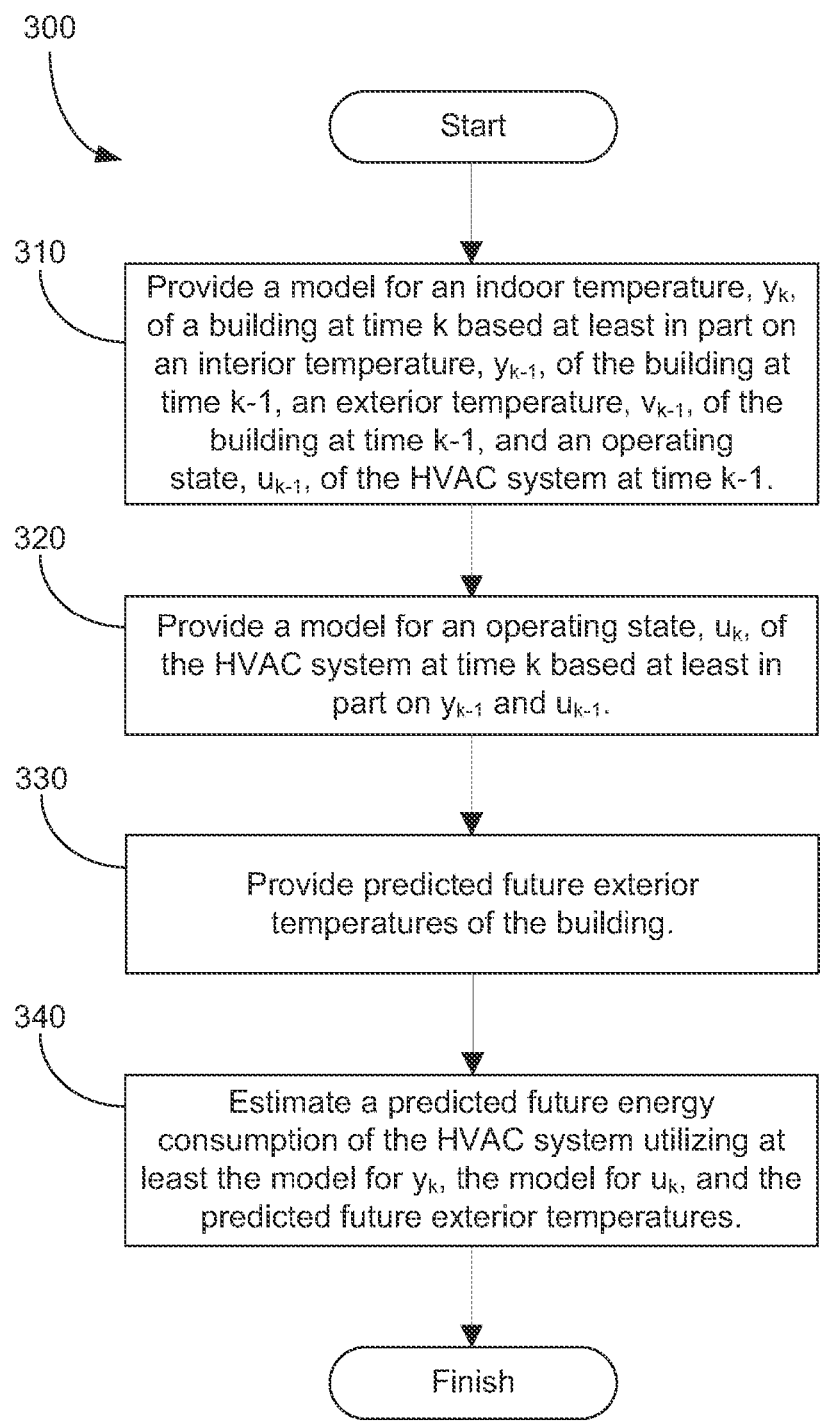
FIG. 3 illustrates a method for predicting energy consumption of an HVAC system according to an additional exemplary embodiment of the present subject matter.

FIG. 3 illustrates a method 300 for predicting energy consumption of an HVAC system according to an additional exemplary embodiment of the present subject matter. Method 300 can be used to predict energy consumption of any suitable HVAC system, such as HVAC system 110 (FIG. 1). As an example, controller 114 of HVAC system 110 can be programmed to implement method 300. Utilizing method 300, a predicted future energy consumption of HVAC system 110 can be estimated, and, e.g., a user can adjust HVAC system 110 to improve energy efficiency of HVAC system 110 or adjust an operating temperature of HVAC system 110 to reduce energy consumption of HVAC system 110. Method 300 is similar to method 200 and is discussed in light of the description of method 200 above.

At step 310, a model for an indoor temperature, $y_k$, of building 100 at time k based at least in part on an interior temperature, $y_{k-1}$, of building 100 at time k−1, an exterior temperature, $v_{k-1}$, of building 100 at time k−1, and an operating state, $u_{k-1}$, of HVAC system 110 at time k−1 is provided. The model for y can be any suitable model. As an example, the model for y can be a second order linear model, e.g., such that the model for y is given as $$y_k = a_1 y_{k-1} + a_2 y_{k-2} + b_1 v_{k-1} + b_2 u_{k-1}$$

and described above.

At step 320, a model for an operating state, $u_k$, of HVAC system 110 at time k based at least in part on $y_{k-1}$ and $u_{k-1}$ is provided. The model for u can be any suitable model. As an example, the model for u can be given as $$u_k = \begin{cases} 1 & \text{if } u_{k-1} = 0, y_{k-1} < L_{k-1} \\ 1 & \text{if } u_{k-1} = 1, y_{k-1} < H_{k-1} \\ 0 & \text{otherwise} \end{cases}$$

and described above.

At step 330, predicted future exterior temperatures of building 100 are provided. As an example, controller 114 can receive the predicted future exterior temperatures of building 100 at step 330. The predicted future exterior temperatures of building 100 can come from any suitable source. For example, the predicted future exterior temperatures of building 100 can be based upon weather forecast data or historical weather data.

At step 340, controller 114 estimates a predicted future energy consumption of HVAC system 110 utilizing at least the model for $y_k$, the model for $u_k$, and the predicted future exterior temperatures. The predicted future energy consumption of HVAC system 110 can be predicted using the following, $$\sum_{k=1}^{N} p(k)(ev \cdot u_k + eu_0(1 - u_k))$$

described above. Thus, a user of HVAC system 110 can anticipate and evaluate the energy consumption of HVAC system 110 in light of the temperature settings or control temperatures of HVAC system 110.

In additional exemplary embodiments, the user can adjust the temperature settings of HVAC system 110 based upon the predicted future energy consumption of HVAC system 110 from step 340. For example, if the user finds the energy consumption too high, the user can adjust the temperature setting to reduce energy consumption. Conversely, the user can also adjust the temperature setting to increase energy consumption if the user finds the energy consumption sufficiently low.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for predicting energy consumption of an HVAC system, the HVAC system configured for cooling air within a building, heating air within a building, or both, the method comprising:

providing a model for an indoor temperature, y, of the building;

providing a model for an operating state, u, of the HVAC system;

providing predicted future outdoor temperatures;

calculating predicted future indoor temperatures of the building and predicted future operating states of the HVAC system utilizing at least the model for y, the model for u, and the predicted future outdoor temperatures;

estimating a predicted future energy consumption of the HVAC system based at least in part on the predicted future operating states of the HVAC system; and changing a control temperature of the HVAC system based at least in part upon the predicted future energy consumption of the HVAC system, wherein the model for y comprises $$y_k = a_1 y_{k-1} + a_2 y_{k-2} + b_1 v_{k-1} + b_2 u_{k-1}$$

where $y_k$ is an indoor temperature of the building at time k,
$y_{k-1}$ is an indoor temperature of the building at time k−1,
$y_{k-2}$ is an indoor temperature of the building at time k−2,
$v_{k-1}$ is an outdoor temperature at time k−1,
$u_{k-1}$ is an operating state of the HVAC system at time k−1, and
$a_1$, $a_2$, $b_1$, and $b_2$ are constants.

2. The method of claim 1, wherein the model for u comprises $$u_k = \begin{cases} 1 & \text{if } u_{k-1} = 0, y_{k-1} < L_{k-1} \\ 1 & \text{if } u_{k-1} = 1, y_{k-1} < H_{k-1} \\ 0 & \text{otherwise} \end{cases}$$

where $u_k$ is an operating state for the HVAC system at time k,
$u_{k-1}$ is an operating state of the HVAC system at time k−1, $y_{k-1}$ is an indoor temperature of the building at time k−1,
$L_{k-1}$ is a low set temperature of the HVAC system at time k−1, and
$H_{k-1}$ is a high set temperature of the HVAC system at time k−1.

3. The method of claim 1, wherein said step of estimating comprises estimating the predicted future energy consumption of the HVAC system using the following:

$$\sum_{k=1}^{N} ev \cdot u_k + eu_0(1 - u_k)$$

where
$u_k$ is an operating state of the HVAC system at time k,
$ev$ is an average energy usage of the HVAC system when the HVAC is on,
$eu_0$ is an average energy usage of the HVAC system when the HVAC is off, and
N is a terminal time.

4. The method of claim 1, further comprising forecasting a predicted future operating cost for the HVAC system based at least in part on the predicted future HVAC operating states.

5. The method of claim 4, further comprising changing a control temperature of the HVAC system based at least in part upon the predicted future operating cost for the HVAC system.

6. The method of claim 4, wherein said step of forecasting comprises forecasting the predicted future operating cost for the HVAC system using the following:

$$\sum_{k=1}^{N} p(k)(ev \cdot u_k + eu_0(1 - u_k))$$

where
$u_k$ is an operating state for the HVAC system at time k,
$p(k)$ is a unit price for energy at time k,
$ev$ is an average energy usage of the HVAC system when the HVAC is on,
$eu_0$ is an average energy usage of the HVAC system when the HVAC is off, and
N is a terminal time.

7. The method of claim 1, further comprising adjusting a control temperature of the HVAC system based upon the predicted future energy consumption of the HVAC system.

8. The method of claim 1, wherein said step of providing predicted future outdoor temperatures comprises determining predicted future outdoor temperatures based upon weather forecast data.

9. The method of claim 8, wherein said step of providing predicted future outdoor temperatures comprises providing predicted future outdoor temperatures using the following:

$$f(t) = \begin{cases} \dfrac{T_{max}(k) + T_{min}(k)}{2} - \dfrac{T_{max}(k) - T_{min}(k)}{2}\cos\left(\dfrac{\pi(t - t_{min}(k))}{t_{max}(k) - t_{min}(k)}\right) & t \in [t_{min}(k), t_{max}(k)) \\ \dfrac{T_{max}(k) + T_{min}(k+1)}{2} + \dfrac{T_{max}(k) - T_{min}(k+1)}{2}\cos\left(\dfrac{\pi(t - t_{max}(k))}{t_{min}(k+1) - t_{max}(k)}\right) & t \in [t_{max}(k), t_{min}(k+1)) \end{cases}$$

where
$T_{max}(k)$ is a maximum temperature on day k,
$T_{min}(k)$ is a minimum temperature on day k,
$t_{max}(k)$ is a time of day for $T_{max}(k)$, and
$t_{min}(k)$ is a time of day for $T_{min}(k)$.

10. A method for predicting energy consumption of an HVAC system, the HVAC system configured for cooling air within a building, heating air within a building, or both, the method comprising:
providing a model for an indoor temperature, $y_k$, of the building at time k based at least in part on an interior temperature, $y_{k-1}$, of the building at time k−1, an exterior temperature, $v_{k-1}$, of the building at time k−1, and an operating state, $u_{k-1}$, of the HVAC system at time k−1;
providing a model for an operating state, $u_k$, of the HVAC system at time k based at least in part on $y_{k-1}$ and $u_{k-1}$;
providing predicted future exterior temperatures of the building;
estimating a predicted future energy consumption of the HVAC system utilizing at least the model for $y_k$, the model for $u_k$, and the predicted future exterior temperatures; and
changing a control temperature of the HVAC system based at least in part upon the predicted future energy consumption of the HVAC system,
wherein the model for $u_k$ comprises $$u_k = \begin{cases} 1 & \text{if } u_{k-1} = 0,\ y_{k-1} < L_{k-1} \\ 1 & \text{if } u_{k-1} = 1,\ y_{k-1} < H_{k-1} \\ 0 & \text{otherwise} \end{cases}$$

where
$L_{k-1}$ is a low set temperature of the HVAC system at time k−1 and
$H_{k-1}$ is a high set temperature of the HVAC system at time k−1.

11. The method of claim 10, wherein the model for $y_k$ comprises a second order linear model.

12. The method of claim 11, wherein the model for $y_k$ comprises $$y_k = a_1 y_{k-1} + a_2 y_{k-2} + b_1 v_{k-1} + b_2 u_{k-1}$$

where
$a_1, a_2, b_1,$ and $b_2$ are constants and
$y_{k-2}$ is an indoor temperature of the building at time k−2.

13. The method of claim 10, further comprising forecasting a predicted future operating cost for the HVAC system based at least in part on the predicted future energy consumption of the HVAC system.

14. The method of claim 13, further comprising changing a control temperature of the HVAC system based at least in part upon the predicted future operating cost for the HVAC system.

15. The method of claim 13, wherein said step of forecasting comprises forecasting the predicted future operating cost for the HVAC system using the following:

$$\sum_{k=1}^{N} p(k)(ev \cdot u_k + eu_0(1 - u_k))$$

where
p(k) is a unit price for energy;
ev is an average energy usage of the HVAC system when the HVAC is cooling or heating air within the building,
$eu_0$ is an average energy usage of the HVAC system when the HVAC is not cooling or heating air within the building, and
N is a terminal time.

16. The method of claim 10, further comprising adjusting a control temperature of the HVAC system based upon the predicted future energy consumption of the HVAC system.

17. The method of claim 10, wherein said step of providing predicted future exterior temperatures of the building comprises determining predicted future exterior temperatures of the building based upon weather forecast data or historical weather data.

* * * * *